United States Patent
Herrmann et al.

(10) Patent No.: US 9,537,063 B2
(45) Date of Patent: Jan. 3, 2017

(54) METHOD FOR PRODUCING AN OPTOELECTRONIC COMPONENT

(71) Applicant: OSRAM Opto Semiconductors GmbH, Regensburg (DE)

(72) Inventors: Siegfried Herrmann, Neukirchen (DE); Wolfgang Moench, Pentling (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 0 days.

(21) Appl. No.: 14/418,860

(22) PCT Filed: Jul. 9, 2013

(86) PCT No.: PCT/EP2013/064483
§ 371 (c)(1),
(2) Date: Jan. 30, 2015

(87) PCT Pub. No.: WO2014/019816
PCT Pub. Date: Feb. 6, 2014

(65) Prior Publication Data
US 2015/0207044 A1  Jul. 23, 2015

(30) Foreign Application Priority Data

Jul. 30, 2012  (DE) .................. 10 2012 106 949

(51) Int. Cl.
*H01L 33/00* (2010.01)
*H01L 21/00* (2006.01)
(Continued)

(52) U.S. Cl.
CPC ............. *H01L 33/505* (2013.01); *H01L 22/10* (2013.01); *H01L 22/12* (2013.01); *H01L 22/26* (2013.01);
(Continued)

(58) Field of Classification Search
CPC ...... H01L 33/505; H01L 33/504; H01L 33/50; H01L 2933/0041; H01L 22/10; H01L 22/12; H01L 22/26
(Continued)

(56) References Cited

U.S. PATENT DOCUMENTS

2008/0122343 A1* 5/2008 Maruyama ............... H01J 1/63
313/503
2010/0090245 A1 4/2010 Lin et al.
(Continued)

FOREIGN PATENT DOCUMENTS

CN 101807654 A 8/2010
DE 102004022648 A1 12/2005
(Continued)

OTHER PUBLICATIONS

"Aerosol Jet Technology" Data Sheet; <http://www.optomec.com/Additive-Manufacturing-Technology/Printed-Electronics>, downloaded Sep. 15, 2011.

*Primary Examiner* — Fernando L Toledo
*Assistant Examiner* — Aaron Gray
(74) *Attorney, Agent, or Firm* — McDermott Will & Emery LLP (57) ABSTRACT

A method for producing a plurality of optoelectronic components (100) comprises the steps: providing a semiconductor body (101) that is arranged on a carrier (114); and applying a converter material (105) to the semiconductor body (101) by means of a photoconductive transfer element (120).

14 Claims, 4 Drawing Sheets

(51) Int. Cl.
*H01L 33/50* (2010.01)
*H01L 21/66* (2006.01)

(52) U.S. Cl.
CPC ... *H01L 33/0095* (2013.01); *H01L 2924/0002* (2013.01); *H01L 2933/0041* (2013.01)

(58) Field of Classification Search
USPC ............ 257/98, 100, E33.061; 438/27, 7, 29
See application file for complete search history.

(56) References Cited

U.S. PATENT DOCUMENTS

| | | | |
|---|---|---|---|
| 2011/0058372 A1* | 3/2011 | Lerman | H05K 1/0204 362/235 |
| 2012/0068594 A1* | 3/2012 | Ibbetson | H01L 33/501 313/501 |
| 2013/0143339 A1* | 6/2013 | Tischler | H01L 33/50 438/27 |

FOREIGN PATENT DOCUMENTS

| | | |
|---|---|---|
| DE | 202005018237 U1 | 3/2006 |
| DE | 102005045375 A1 | 3/2007 |
| DE | 102010053326 A1 | 8/2011 |
| JP | H11233832 A | 8/1999 |
| JP | 2006-303373 A | 11/2006 |
| JP | 2010186968 A | 8/2010 |
| JP | 2012119673 A | 6/2012 |
| WO | 2010/025849 A1 | 3/2010 |
| WO | 2011/079325 A1 | 6/2011 |

\* cited by examiner

METHOD FOR PRODUCING AN OPTOELECTRONIC COMPONENT

The invention relates to a method for producing an optoelectronic component, in particular an optoelectronic component in which at least a portion of a radiation emitted by a chip is wavelength-converted.

The conversion of the light which is generated by an optoelectronic component, e.g. an LED chip, is used e.g. in order to generate white light by an additive colour mixture by means of blue-emitting LED chips. The light emitted by the chip can be converted completely or partially. The converter is e.g. dyestuffs which are embedded in a polymer matrix, or ceramic platelets consisting of sintered phosphor particles. The degree of conversion is determined by parameters such as e.g. the layer thickness and porosity of the converter platelet, the particle size and the temperature. In order to produce a chip converter system, the converter platelet is frequently placed onto the chip by means of layer transfer.

The chromaticity coordinate of the chip converter system is intended to correspond as precisely as possible to a specified chromaticity coordinate, wherein a uniform chromaticity coordinate of all systems which are jointly produced, or a specific distribution could be desirable. To this end, the individual chip converter systems of a wafer are sorted e.g. according to the singulation in dependence upon their chromaticity coordinate. The chromaticity coordinate distribution of the systems is very broad by reason of various effects, e.g. by reason of a varying directional characteristic of the chip, variations in the adhesive layer thickness between the chip surface and the converter platelet and during placement of the converter platelet.

It is desired to provide a method for producing an optoelectronic component, which enables precise and cost-effective adaptation of at least one property of the optoelectronic component to a specified desired value.

In one embodiment of the invention, a method for producing an optoelectronic component comprises providing a semiconductor body which is arranged on a carrier. In each case, a converter material is applied to the semiconductor body by means of a photoconductive transfer element.

The semiconductor body is provided in particular on a so-called artificial wafer. The carrier is different from the growth substrate of the semiconductor bodies. Moreover, the semiconductor body is electrically coupled to the carrier by means of a contact wiring. In accordance with embodiments, a plurality of semiconductors are arranged on the carrier.

By applying the converter material by means of the photoconductive transfer element, it is possible to specify in an individually precise manner the amount of converter material for each individual semiconductor body. As a result, it is readily possible during the production process to adjust the chromaticity coordinate in a controlled manner.

In accordance with embodiments, the applying of the converter material comprises electrostatic charging of the photoconductive transfer element. Regions of the photoconductive transfer element are discharged in dependence upon a specified pattern. The converter material is applied to the photoconductive transfer element by electrostatic attraction. The converter material is transferred from the photoconductive transfer element to the semiconductor bodies by means of electromagnetic fields.

By electrostatically charging the photoconductive transfer element and by subsequently discharging regions thereof, it is possible to precisely adjust the amount of converter material which is applied to the semiconductor body. The converter material is attracted to the transfer element by means of electrostatic attraction to the non-discharged regions of the transfer element. The non-discharged regions correspond subsequently to the position of the semiconductor body relative to the transfer element.

By means of the electrostatic attraction, the converter material is arranged in each case on the regions of the transfer element which subsequently correspond to the respective position of semiconductor bodies, if a plurality of semiconductor bodies are provided. By virtue of the fact that regions of the photoconductive transfer element are discharged, the amount of converter material applied in each case to the semiconductor bodies is adjusted. The specified pattern corresponds e.g. to an amount of converter material to be applied, which is specified for each individual semiconductor body. Therefore, it is e.g. possible to coat a first semiconductor body precisely with a specified amount of converter material in a joint process independently of a second semiconductor body.

In accordance with further embodiments, regions of the photoconductive transfer element are discharged by irradiation of light. For example, the light is irradiated by means of an LED.

In accordance with embodiments, the converter material is fixed after it has been applied. For example, fixing is effected thermally. To this end, the converter material comprises an adhesive which can be thermally activated. In accordance with further embodiments, fixing is effected by means of a fixing layer which is applied to the converter material. In particular, the fixing layer is applied in liquid form and subsequently hardened.

In accordance with embodiments, the converter material is applied in the form of a powder. The powder comprises e.g. SiO2 and/or Al2O3 and/or an oxide and/or a nitride. In accordance with further embodiments, the powder comprises a CE-doped garnet material. In particular, the individual particles of the converter material are 3 to 15 µm in size.

A suitable converter material is e.g. one of the following materials: rare earth-doped garnets, rare earth-doped alkaline earth sulphides, rare earth-doped thiogallates, rare earth-doped aluminates, rare earth-doped silicates, rare earth-doped orthosilicates, rare earth-doped chlorosilicates, rare earth-doped alkaline earth silicon nitrides, rare earth-doped oxynitrides, rare earth-doped alumina nitrides, rare earth-doped silicon nitrides, rare earth-doped sialons.

In accordance with further embodiments, the method comprises the applying of a converter layer, which comprises a second converter material, at least to the side of the semiconductor body facing away from the carrier.

A value of at least one characteristic variable in each case of the semiconductor body is determined. The respective, determined values are compared with specified desired values of the characteristic variable. A respective deviation between the determined values and the specified desired values is determined. Subsequently, the converter material is applied to the converter layer in a region of the semiconductor body by means of photoconductive transfer element in dependence upon the respectively determined deviation.

If a plurality of semiconductor bodies are arranged on the common carrier, the value(s) of each semiconductor body is/are determined. Subsequently, the amount of converter material, which is still additionally to be applied, for each individual semiconductor body is determined in dependence upon the deviation from the respective desired values. Then, the determined amount is applied in each case to the regions of the semiconductor bodies. Therefore, it is possible to adapt each semiconductor body individually to the respectively specified desired value(s).

The converter layer which comprises a second converter material preferably comprises a radiation-transmissive matrix material, to which a luminescent substance is added. The matrix material can comprise e.g. SiO2 and/or Al2O3. In accordance with further embodiments, the matrix material comprises an oxide and/or a nitride. In accordance with further embodiments, the matrix material comprises a Ce-doped garnet material. In accordance with further embodiments, the matrix material comprises a silicone or polysilazanes. Furthermore, the matrix material can also comprise or consist of an epoxide.

In general, the converter material is a luminescent substance. For example, the converter material is formed as luminescent substance particles.

The converter layer extends in particular in an uninterrupted manner over all of the semiconductor bodies arranged on the common carrier. During operation, the converter layer effects a first wavelength conversion of the primary radiation of the semiconductor bodies. However, this is different from semiconductor body to semiconductor body, e.g. in dependence upon the respective primary radiation of the semiconductor bodies and/or the respective thickness in the converter layer in the region of the first and second semiconductor body. These deviations from one another and from a specified desired value are corrected by the subsequent additional application of the converter material.

In accordance with embodiments, the correction can be effected in a simple and precise manner by application by means of the transfer element, as the discharging of regions of the transfer element and therefore the amount of converter material for the respective semiconductor bodies are effected in dependence upon the determined deviation between a determined value and desired value of the characteristic variable. For example, the determining of the value of the at least one characteristic variable includes in each case determining at least one of the following: the wavelength of the radiation emitted by the respective coated semiconductor body, the spectrum of the radiation emitted by the respective coated semiconductor body, the chromaticity coordinate of the radiation emitted by the respective coated semiconductor body and the efficiency of the coated semiconductor body.

The value of at least one characteristic variable is determined and the wavelength conversion is controlled thereby. The value of the characteristic variable is adjusted once again by means of the subsequent application of the converter material.

The method is suitable for the simultaneous production of a plurality of optoelectronic components through the use of a multiplicity of similar semiconductor bodies, so that the optoelectronic components of the plurality of optoelectronic components each comprise the most precise possible value of the specified characteristic variable.

In accordance with embodiments, a matrix material is applied to the semiconductor body by means of the photoconductive transfer element. In particular, the matrix material is a material of the converter layer. The matrix material comprises e.g. silicone and/or polysilazanes and/or a further matrix material of the converter layer. It is thus possible to transfer a heterogeneous material combination to the semiconductor body.

In accordance with embodiments, the applying of the converter material to the semiconductor body comprises applying the converter material to a further transfer element by means of the photoconductive transfer element. The further transfer element comprises e.g. a Teflon film, a roller consisting of metal, a roller consisting of synthetic material and/or a stamp. The converter material is transferred by the further transfer element to the semiconductor body. In accordance with further embodiments, matrix materials of the converter layer, in addition to the converter material, are also transferred to the semiconductor body by means of the further transfer element.

In accordance with further embodiments, the further transfer element comprises a wafer, e.g. consisting of ceramic, polysilazane or silicone. At least one physical property of the converter material is changed after being applied to the further transfer element and before being transferred to the semiconductor body. For example, a ceramic wafer is burnt with the converter material.

Further features, advantages and developments are apparent from the following examples explained in conjunction with FIGS. 1A to 1E. Identical or like elements, or elements acting in an identical manner, can be provided with the same reference numerals. The illustrated elements and their size ratios with respect to each other are fundamentally not to be regarded as being to scale.

Figure 1A:
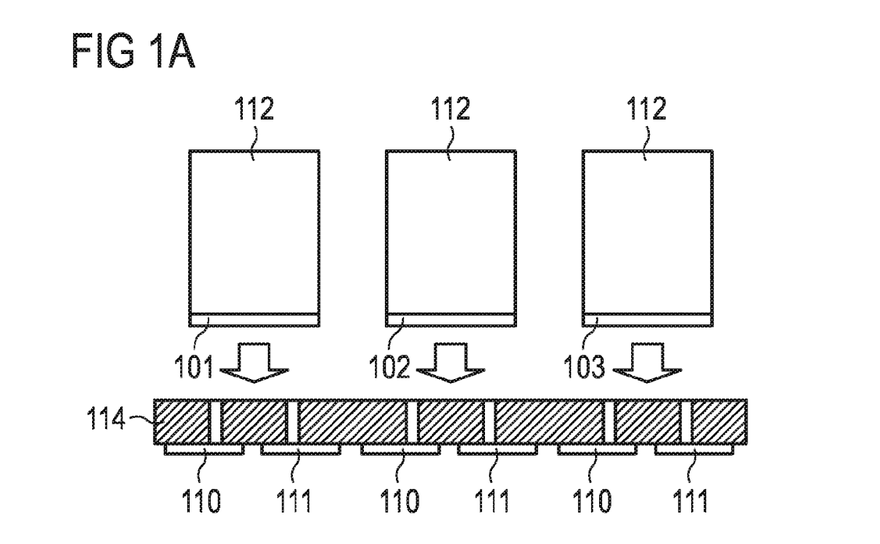
FIGS. 1A to 1E show schematic sectional views of optoelectronic components at various method stages of an exemplified embodiment.

FIG. 1A shows a plurality of semiconductor bodies 101, 102 and 103. The semiconductor bodies 101, 102 and 103 each comprise epitaxial layers and are coupled to a respective growth substrate 112.

A planar carrier 114 for carrying and contacting the semiconductor bodies 101 to 103 comprises for each semiconductor body a first contact 110 and a second contact 111 for electrically contacting a respective semiconductor body.

The carrier 114 is a so-called interposer wafer, to which the semiconductor bodies 101 to 103 are applied without the respective growth substrate 112.

Figure 1B:
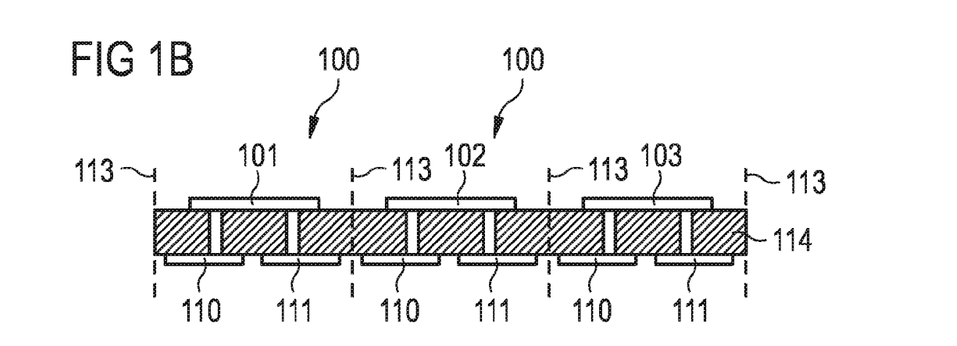

FIG. 1B shows the semiconductor bodies 101 to 103 which are separated from the growth substrates and are coupled to the carrier 114. The semiconductor bodies 101 to 103 are each electrically coupled to a first and a second contact 110, 111. The singulation lines 113 show by way of example the points at which the carrier is singulated at the end of the production method. Singulation serves to form optoelectronic components 100 which comprise one of the semiconductor bodies 101 to 103 and a part of the carrier 114. By arranging the semiconductor bodies 101 to 103 on the carrier 114 and after removing the respective growth substrate 112, a so-called artificial wafer consisting of bond wire-free optoelectronic components is obtained.

In accordance with at least one embodiment of the optoelectronic semiconductor component, the semiconductor bodies are in each case optoelectronic semiconductor bodies, in particular light-emitting diodes, LEDs for short. In a particularly preferred manner, the semiconductor bodies each comprise a semiconductor layer sequence which is epitaxially grown and is based on the nitride compound semiconductor material $Al_nIn_{1-n-m}Ga_mN$, where $0 \leq n \leq 1$, $0 \leq m \leq 1$ and $n+m \leq 1$. The semiconductor layer sequence can comprise dopants and additional component parts. However, for the sake of simplicity only the essential component parts of the crystal lattice of the semiconductor layer sequence, for instance Al, Ga, In and N, are stated, even if they can be partially replaced and/or supplemented by small amounts of further substances.

In accordance with embodiments, the respective position of the semiconductor bodies 101 to 103 is specified in dependence upon respective values of characteristic properties of the semiconductor bodies 101 to 103. Therefore, the semiconductor bodies 101 to 103 are arranged in a sorted manner on the carrier 114. For example, the sorting is effected in dependence upon the respective chromaticity coordinate of the semiconductor bodies 101 to 103.

The number of three semiconductor bodies 101 to 103, shown by way of example, on the carrier 114 is to be understood merely as an example. In accordance with embodiments, more than three semiconductor bodies are arranged on the carrier 114. In accordance with further embodiments, less than three semiconductor bodies, e.g. two semiconductor bodies, are arranged on the carrier 114.

Figure 1C:
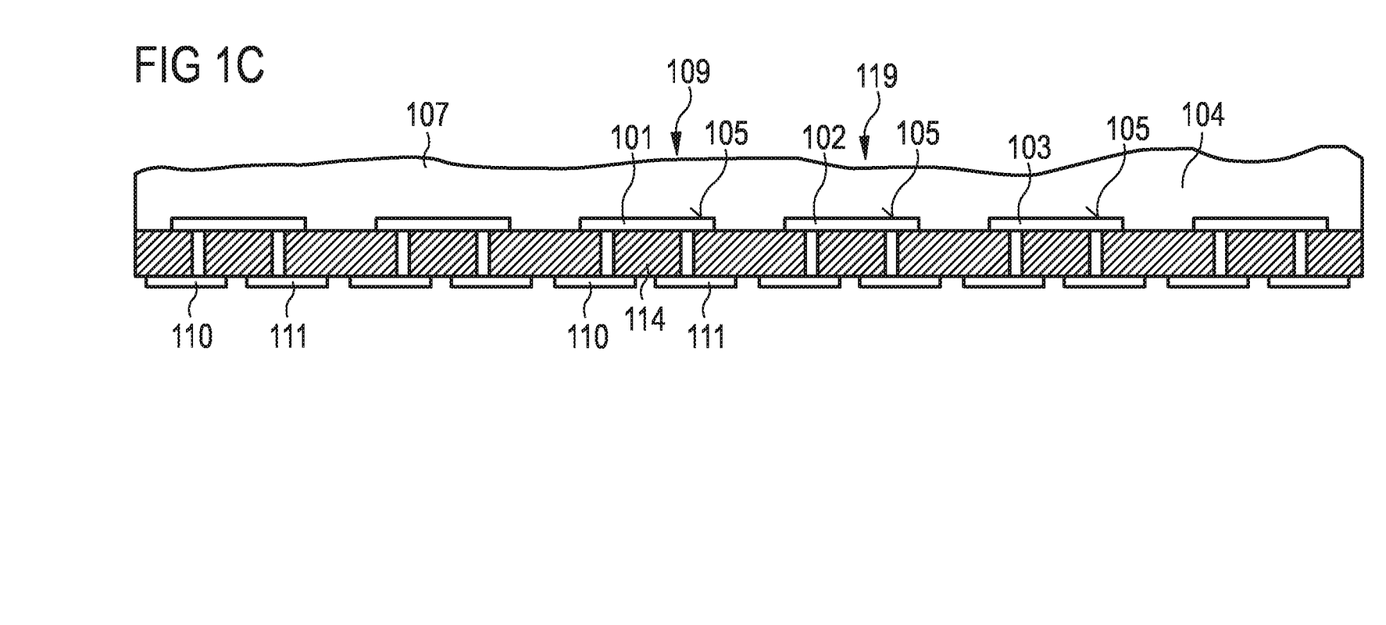

FIG. 1C shows the arrangement of FIG. 1B, wherein six semiconductor bodies are illustrated on the carrier 114. A converter layer 107 is applied to the side of the carrier 114, on which the semiconductor bodies 101 to 103 are arranged. The converter layer 107 is arranged in such a manner that in each case at least one side 105 of the semiconductor bodies 101 to 103 which is facing away from the carrier 114 is covered by the converter layer 107. In addition, the flanks of the semiconductor bodies 101 to 103 are each covered by the converter layer 107.

In accordance with embodiments, the converter layer is applied by coating with a doctor knife. In accordance with further embodiments, the converter layer is applied by spray-coating. In accordance with further embodiments, the converter layer is applied by dip-coating. In accordance with further embodiments, the converter layer is applied by screen printing. In accordance with further embodiments, the converter layer is applied by stencil printing. In accordance with further embodiments, the converter layer is applied by spin printing. In accordance with further embodiments, the converter layer 107 is applied by a further method, by means of which it is possible to apply a layer, which comprises converter material, on the carrier 114 comprising the semiconductor bodies 101 to 103.

Since the artificial wafer which comprises the carrier 114 and the semiconductor bodies 101 to 103 comprises, on the side on which the semiconductor bodies 101 to 103 are arranged, a substantially planar surface as the semiconductor bodies 101 to 103 are only approximately 6 μm in height, the artificial wafer can be coated effectively on the side on which during operation radiation is emitted. Moreover, the electrical connections are located on the opposite side. Therefore, in accordance with embodiments no bond wires which could possibly be damaged are present.

In accordance with embodiments, the converter layer 107 comprises a converter material 104. The converter material 104 comprises in particular a Ce-doped garnet material, in particular YAG:Ce. The converter material renders it possible to influence the spectral characteristic of the semiconductor bodies 101 to 103 during operation.

In accordance with embodiments, the production process makes the converter layer 107 inhomogeneous over the surface of the carrier 114. For example, the layer thickness, consistency and/or porosity of the converter layer 107 is/are inhomogeneous over the surface of the carrier 114. During operation, these inhomogeneities result in different characteristics of the emitted radiation.

Figure 1D:
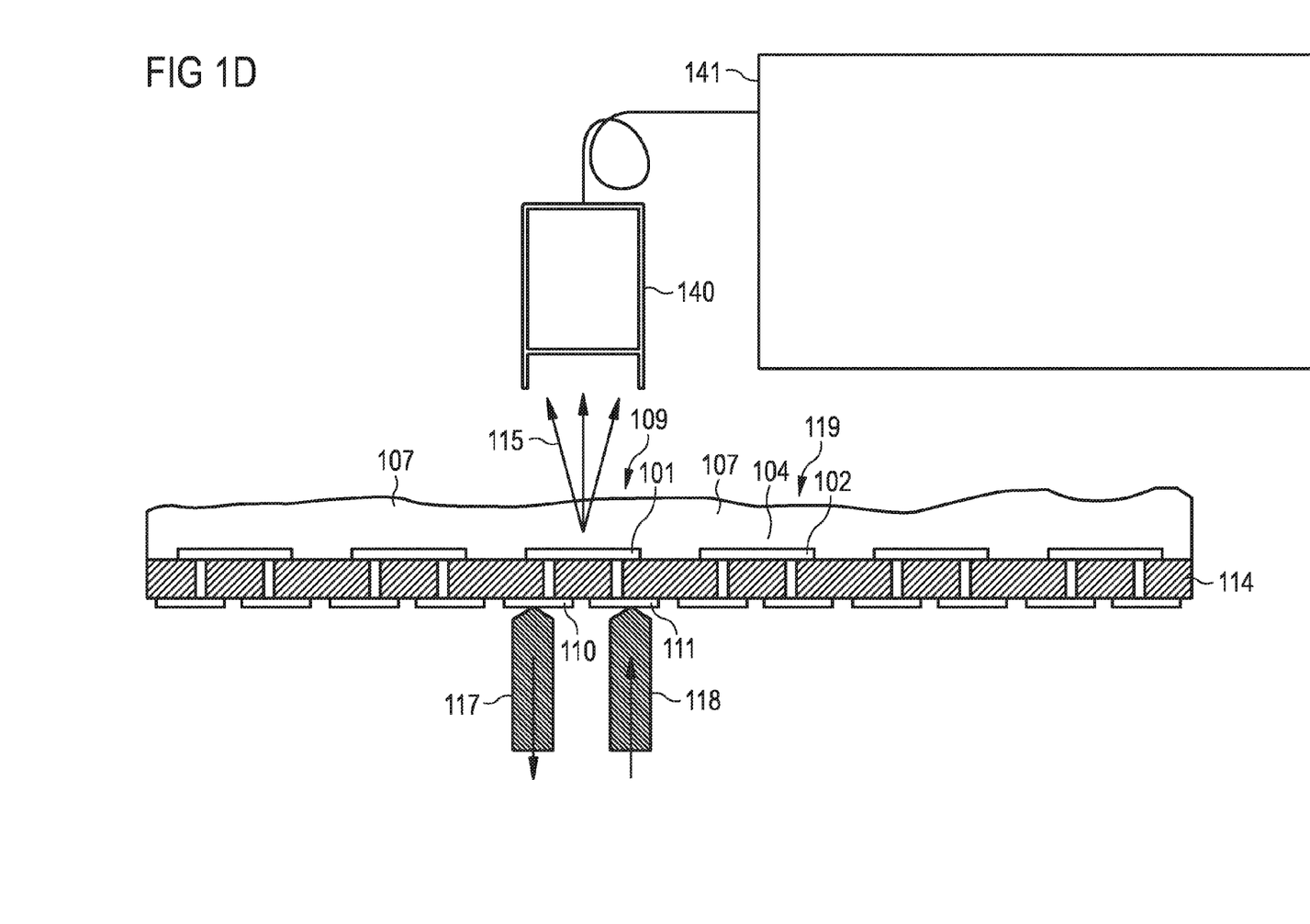

FIG. 1D schematically shows a detector 140 and an evaluating device 141 coupled to the detector 140. The detector 140 is configured to detect radiation 115 of the semiconductor bodies 101 to 103. The evaluating device 141 is configured to determine in each case a value of at least one characteristic variable of the semiconductor bodies 101 to 103 from the detected radiation.

To this end, the semiconductor bodies on the carrier 114 are supplied consecutively with current, e.g. in that the respective contacts 110, 111 are electrically coupled to contact pins 117, 118 which are connected to a current source.

In accordance with embodiments, the evaluating device 141 determines the value of a wavelength of the radiation 115. In accordance with further embodiments, alternatively or in addition the region of the spectrum of the radiation 114 is determined. In accordance with further embodiments, alternatively or in addition the value of the chromaticity coordinate of the radiation 114 is determined. In accordance with further embodiments, alternatively or in addition the value of the efficiency of the coated semiconductor body 101 is determined. In accordance with further embodiments, two or more of the described values are determined by the evaluating device 141.

Furthermore, in accordance with embodiments the respective position of the examined semiconductor body on the carrier 114 is detected. For example, a so-called wafer map is produced.

A desired value is specified for the one or plurality of characteristic variables, for instance the wavelength, spectrum, chromaticity coordinate and/or efficiency. The desired value is specified in particular for each semiconductor body 101, 102 and 103 of the plurality of semiconductor bodies comprising converter material. In accordance with embodiments, the desired values are the same for all the semiconductor bodies 101 to 103 comprising converter material. In accordance with further embodiments, the desired values are specified differently for each semiconductor body comprising converter material.

The evaluating device 141 compares the determined value of the characteristic variable or the determined values of the characteristic variables with the specified desired values. In accordance with embodiments, the converter layer 107 is applied to the carrier 114 such that the desired values are so incorrect that in order to achieve the desired values additional converter material 105 (FIG. 1E) has to be applied.

From the comparison of the determined values with the desired values, the evaluating device 141 determines for each region 109, 119 of a semiconductor body of the semiconductor bodies 101 to 103 how much additional converter material 105 has to be applied in order to achieve the specified desired values. The region 109 is the region on the side of the semiconductor body 101 facing away from the carrier 114 and the region 119 is the region on the side of the semiconductor body 102 facing away from the carrier 114. The regions 109 and 119 are each arranged such that during operation the emitted radiation of the semiconductor bodies 101 and 102 passes through the region 109 and 119 respectively.

Figure 1E:
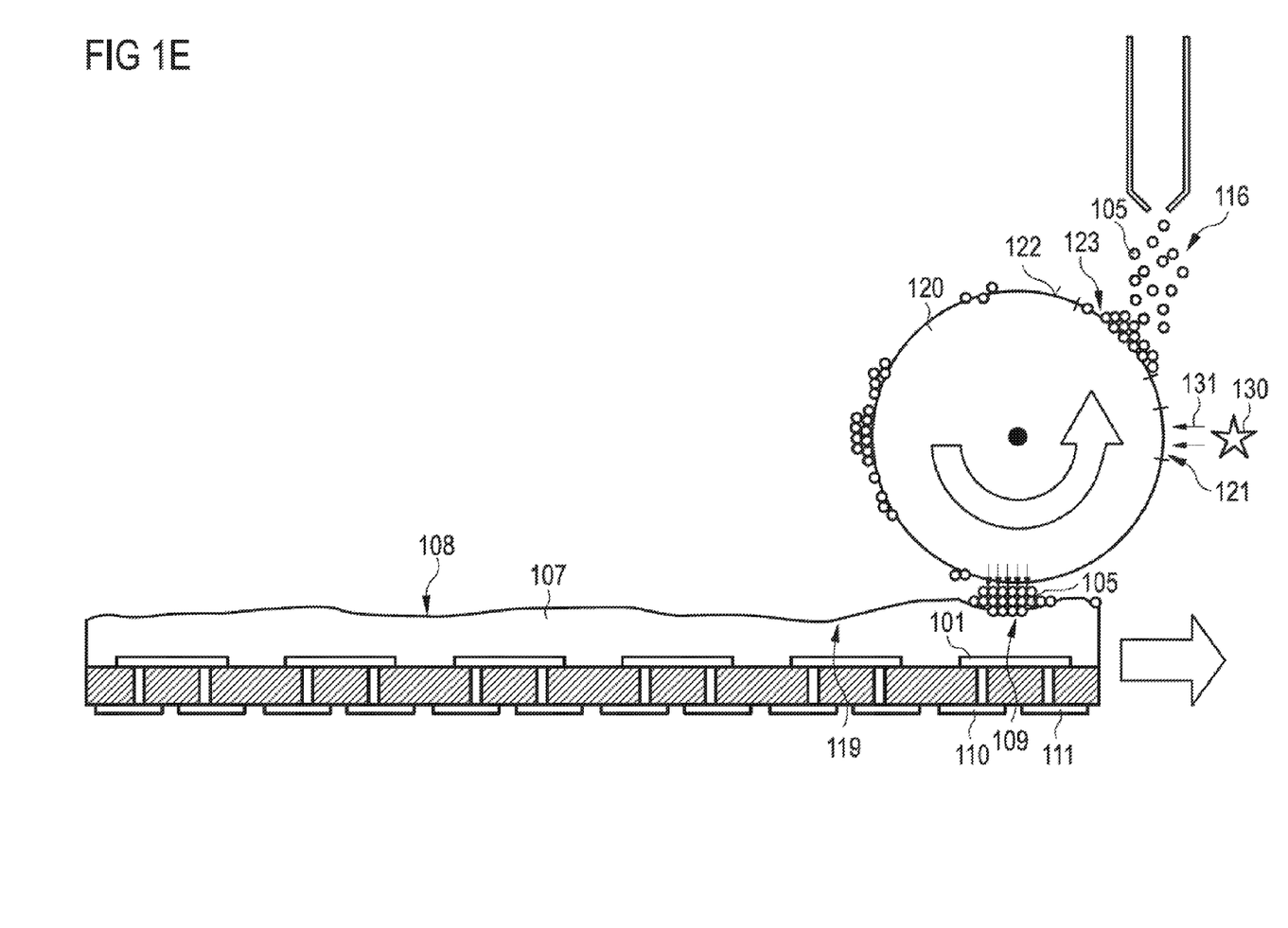

FIG. 1E schematically shows the applying of the additional converter material 105. The additional converter material 105 is present in the form of a powder 116. In accordance with embodiments, the converter material 105 comprises the same material as the converter material 104. In accordance with further embodiments, the converter materials 104 and 105 are different from one another.

The converter material 105 is applied to the side 108 of the converter layer 107 facing away from the carrier 114 by means of a photoconductive transfer element 120. In accordance with embodiments, the converter material is not applied to the entire surface of the side 108 but rather only in regions above the semiconductor bodies. In accordance with embodiments, the regions above the semiconductor bodies are larger than the surface of the semiconductor bodies. For example, the converter material is applied in the region 109 and the region 119 and between the regions 109 and 119 the side 108 remains free of the converter material 105.

In the illustrated exemplified embodiment, the transfer element 120 is a transfer roller. In accordance with further embodiments, differently formed transfer elements are used which are suitable for applying the converter material 105 to the converter layer 107, e.g. a transfer strip.

The transfer element 120 is electrostatically charged. Subsequently, portions of the regions 121 on a surface 122 of the transfer element 120, on which no converter material 105 is to adhere, are discharged by means of a radiation 131 of a light source 130. Discharging can be effected in a different manner. The required pattern on the transfer element 120 is adjusted in dependence upon the measurement data previously recorded as explained in conjunction with FIG. 1D, e.g. in dependence upon the wafer map. The transfer element 120 is discharged in dependence upon the data determined by the evaluating device 141, relating to how much additional converter material 105 has to be applied in which region 109, 119 in order to achieve the specified desired value.

The converter material 105 is transferred to the transfer element 120, in particular by means of electrostatic attraction. The converter material 105 is applied to the transfer element 120 in particular by means of a further roller or a brush (not shown). The converter material 105 adheres to the charged regions 123 of the transfer element 120 and does not adhere to the discharged regions 121 of the transfer element 120.

The transfer element 120 comprises a photoconductive coating, e.g. a-Si:H (amorphous, hydrogenated silicon). Electrostatic charging is effected e.g. by means of corona discharge in the area surrounding the transfer element 120. The dark voltages are approximately 1.5 kV. By means of exposure to light from the light source 130, local charge carriers are generated in the surface of the transfer element 120 and the charged surface is thereby locally discharged. The latent image thus resides in the charge distribution. In accordance with embodiments, the voltages are e.g. 300 to 600 V between the regions exposed to light and unexposed regions. The charge state of the transfer element determines the amount of transferred converter material 105.

The transfer element 120 is moved relative to the carrier 114 such that the converter material 105 is applied to the surface 108 in the respectively provided region 109, 119. The converter material 105 is detached from the transfer element 120 and transferred to the converter layer 107 e.g. by means of electromagnetic fields.

In accordance with embodiments, a control device (not shown) is provided which controls or regulates the movements of the transfer element 120 and of the carrier 114 relative to one another.

In accordance with embodiments, the converter material 105 is subsequently fixed on the converter layer 107. Fixing can be effected e.g. thermally, in particular at temperatures of approximately 200° Celsius. In accordance with further embodiments, an additional fixing layer (not shown) is applied in a planar manner to the side 108 which fixes the converter material 105.

In accordance with embodiments, prior to deposition of the converter layer 107 an ESD diode is provided on the carrier 114 for the semiconductor bodies 101 to 103 or a passivation layer, e.g. consisting of silicon oxide.

The method described renders it possible to achieve the required correction of the amount of converter material per semiconductor body 101 to 103 in a reliable, rapid and precise manner with a high degree of spatial resolution and the desired layer thickness.

In accordance with embodiments, converter layers 107 are applied with a uniform thickness (e.g. for flip-chips). In accordance with further embodiments, the converter layer 107 comprises a specified layer thickness profile comprising different thicknesses.

It is also possible to perform the described method repeatedly on the same artificial wafer. Furthermore, it is possible to integrate the described method in a simple manner into already existing production processes.

The finished wafer after the method step of FIG. 1E still contains only optoelectronic components consisting of a respective semiconductor body 101 to 103 and the converter layer 107 comprising converter material 105, which correspond to the specified desired value(s) for the characteristic variable(s) within specified tolerances.

In accordance with embodiments, the applying of converter material, as explained in conjunction with FIG. 1E, is used for directly applying the converter material 105 to the surface 108 of the semiconductor bodies without the converter layer 107.

The present application claims the priority of German application DE 10 2012 106 949.2, the disclosure content of which is hereby incorporated by reference.

The invention is not limited to the exemplified embodiments by the description using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. A method for producing an optoelectronic component, comprising the steps of:
providing a plurality of semiconductor bodies which are arranged on a carrier, wherein the carrier comprises first electrical contacts and second electrical contacts on a main surface opposite the semiconductor bodies, wherein the first electrical contacts and the second electrical contacts are electrically isolated from each other;
applying a converter material to the semiconductor bodies by means of a photoconductive transfer element;
applying a converter layer, which comprises a second converter material, at least to a side of the semiconductor bodies facing away from the carrier;
determining a value of at least one characteristic variable of the semiconductor bodies, wherein the semiconductor bodies are consecutively supplied with current by contact pins; and
comparing the respective determined values with a specified desired value of the characteristic variable and determining a respective deviation between determined values and a specified desired value,
wherein the step of applying the converter material is performed after the comparing step, the converter material being applied to the converter layer in a region of the semiconductor bodies in dependence upon the respectively determined deviation by means of the photoconductive transfer element.

2. The method according to claim 1, wherein the applying of the converter material comprises:
electrostatically charging the photoconductive transfer element;

discharging regions of the photoconductive transfer element in dependence upon a specified pattern;

applying the converter material to the photoconductive transfer element by means of electrostatic attraction; and transferring the converter material from the photoconductive transfer element to the semiconductor body by means of electromagnetic fields.

3. The method according to claim 2, wherein regions of said transfer element are discharged by irradiation of light.

4. The method according to claim 1, wherein the converter material is fixed after it has been applied.

5. The method according to claim 4, wherein fixing is effected thermally or by applying a fixing layer.

6. The method according to claim 1, wherein the converter material is applied by means of a photo-conductively coated roller or a photoconductive coated strip.

7. The method according to claim 1, wherein the converter material is applied in the form of a powder.

8. The method according to claim 1, wherein the determination of the value of the at least one characteristic variable comprises in each case:

determining at least one of: the wavelength of the radiation emitted by the respective coated semiconductor body, the spectrum of the radiation emitted by the respective coated semiconductor body, the chromaticity coordinate of the radiation emitted by the respective coated semiconductor body and the efficiency of the coated semiconductor body.

9. The method according to claim 2, wherein the specified pattern is specified in dependence upon the determined deviation.

10. The method according to claim 1, wherein a plurality of semiconductor bodies are provided on the carrier, the method further comprising:

determining in each case a value of the at least one characteristic variable of the semiconductor bodies of the plurality of semiconductor bodies;

comparing in each case the respective determined values with a specified desired value of the characteristic variable and in each case determining a respective deviation between determined values and a respectively specified desired value; and subsequently applying in each case the converter material to the converter layer in a region of the semiconductors bodies of the plurality of semiconductors bodies in dependence upon the respectively determined deviation by means of the photoconductive transfer element.

11. The method according to claim 1, wherein the applying of the converter layer comprises at least one of: coating with a doctor knife, spray-coating, dip-coating, screen printing, stencil printing and spin printing.

12. The method according to claim 1, comprising:

applying matrix material to the semiconductor body by means of the photoconductive transfer element.

13. The method according to claim 1, wherein the applying of the converter material to the semiconductor body comprises:

applying the converter material to a further transfer element by means of the photoconductive transfer element; and transferring the converter material from the further transfer element to the semiconductor body.

14. The method according to claim 13, wherein the further transfer element comprises a wafer, and at least one physical property of the converter material is changed after being applied to the further transfer element and before being transferred to the semiconductor body.

* * * * *